(12) United States Patent
Augustin et al.

(10) Patent No.: US 7,184,925 B2
(45) Date of Patent: Feb. 27, 2007

(54) EMULATION OF OPERATIONAL CHARACTERISTICS OF ELECTRONIC DEVICE

(75) Inventors: Thom Augustin, El Dorado Hills, CA (US); Christopher Gregory Malone, Loomis, CA (US); Glenn Cochran Simon, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 188 days.

(21) Appl. No.: 10/738,298

(22) Filed: Dec. 17, 2003

(65) Prior Publication Data

US 2005/0133205 A1    Jun. 23, 2005

(51) Int. Cl.
*G01K 1/08* (2006.01)

(52) U.S. Cl. .................... 702/132; 73/75; 324/760; 361/687; 700/276; 700/278; 700/299; 703/14

(58) Field of Classification Search ........ 702/130–132; 700/299, 300, 301, 304, 276, 278; 318/471; 361/103, 695; 165/122; 322/46; 381/333; 374/5, 43; 324/760; 703/6, 13, 14; 73/75
See application file for complete search history.

(56) References Cited

U.S. PATENT DOCUMENTS

| | | | |
|---|---|---|---|
| 4,669,025 A | 5/1987 | Barker et al. | |
| 4,727,450 A | 2/1988 | Fachinetti et al. | |
| 5,311,448 A | 5/1994 | Waggoner et al. | |
| 5,809,826 A * | 9/1998 | Baker, Jr. | 73/75 |
| 5,828,768 A * | 10/1998 | Eatwell et al. | 381/333 |
| 6,034,511 A * | 3/2000 | Scott et al. | 322/46 |
| 6,039,471 A | 3/2000 | Wyland | |
| 6,134,511 A | 10/2000 | Subbarao | |
| 6,330,155 B1 * | 12/2001 | Remsburg | 361/695 |
| 6,559,667 B1 | 5/2003 | Tarter | |
| 6,595,684 B1 | 7/2003 | Casagrande et al. | |
| 6,826,456 B1 * | 11/2004 | Irving et al. | 700/299 |
| 6,934,670 B2 * | 8/2005 | Jain et al. | 703/14 |
| 2003/0055613 A1 | 3/2003 | Tsai | |

FOREIGN PATENT DOCUMENTS

WO    WO1992/11606    7/1992

OTHER PUBLICATIONS

"Baffle"; Dictionary.Com; http://dictionary.reference.com/search?q= baffle; Lexico, LLC; Lexico, LLC, 13428 Maxella Avenue #236, Marina del Rey, CA 90292;Sep. 30, 2003, pp. 1-4, USA.
"Thermal"; Dictionary.com; http://dictionary.reference.com/search?q= thermal; Lexico, LLC; Lexico, LLC, 13428 Maxella Avenue #236, Marina del Rey, CA 90292; Oct. 21, 2003, pp. 1-3, USA.
"OT F Strip Heater Series"; Omega.com; http://www.omega.com/ppt/pptsc.asp?ref= OT F_HEATER, Stanford, CT 06907; Aug. 28, 2003; pp. 1-6, USA.

* cited by examiner

*Primary Examiner*—Michael Nghiem
*Assistant Examiner*—John Le

(57) ABSTRACT

An apparatus in one example comprises one or more control components that emulate one or more operational characteristics of one or more electronic devices through employment of one or more thermal components coupled with a frame.

27 Claims, 4 Drawing Sheets

EMULATION OF OPERATIONAL CHARACTERISTICS OF ELECTRONIC DEVICE

CROSS-REFERENCE TO RELATED APPLICATION

This application contains subject matter that is related to the subject matter of the following application, which is assigned to the same assignee as this application. The below-listed application is hereby incorporated herein by reference in its entirety:

"ELECTRONIC DEVICE ENVIRONMENTAL EFFECT PREDICTION," by Malone, et al., co-filed herewith.

BACKGROUND

In the design of various electronic devices, one desire is to reduce the size or footprint of the electronic device. Power levels for electronic devices have increased in recent years. Enclosures that contain electronic components of the electronic device, for example, computer cases and rack-mount frames, have also been reduced in size to allow for a smaller footprint of the device. This trend has created significant thermal issues for the electronic components of the electronic device.

The electronic devices comprise a plurality of the electronic components, for example, power supplies, processors, circuit boards, and storage components. The quantity of electronic components and thermal energy each electronic component produces inside the computer case affects the total amount of thermal energy dissipated in the computer case. To sufficiently cool the electronic components, fans are used to create airflow through the computer case that promotes a removal of the thermal energy from the computer case. The electronic components, fans, and computer case affect operational characteristics of the electronic device, for example, thermal energy dissipation, airflow, and noise characteristics.

SUMMARY

The invention in one implementation encompasses an apparatus. The apparatus comprises one or more control components that emulate one or more operational characteristics of one or more electronic devices through employment of one or more thermal components coupled with a frame.

Another implementation of the invention encompasses an apparatus. The apparatus comprises means for regulating generation of thermal energy. The apparatus comprises means for emulating one or more operational characteristics of one or more electronic devices for the one or more electronic devices through employment of the thermal energy.

Yet another implementation of the invention encompasses a method. One or more of one or more temperature characteristics, one or more thermal energy dissipation characteristics, one or more airflow characteristics, and one or more noise characteristics of one or more electronic devices are emulated for the one or more electronic devices.

A further implementation of the invention encompasses an article. The article comprises one or more computer-readable signal-bearing media. The article includes means in the one or more media for emulating one or more of one or more temperature characteristics, one or more thermal energy dissipation characteristics, one or more airflow characteristics, and one or more noise characteristics of one or more electronic devices.

DESCRIPTION OF THE DRAWINGS

Features of exemplary implementations of the invention will become apparent from the description, the claims, and the accompanying drawings in which:

DETAILED DESCRIPTION

Referring to the BACKGROUND section above, electronic devices require expensive electronic components on hand and time for a technician to configure the electronic components, fans, and case. The electronic device may cost thousands of dollars in purchase cost alone, with additional costs for service and configuration. It is desirable to use less expensive components to reduce costs of validating electronic devices in a test environment. Emulation of relevant operational characteristics of the electronic devices promotes a decrease in cost of testing the operational characteristics by substituting expensive electronic components for simple components.

Figure 1:
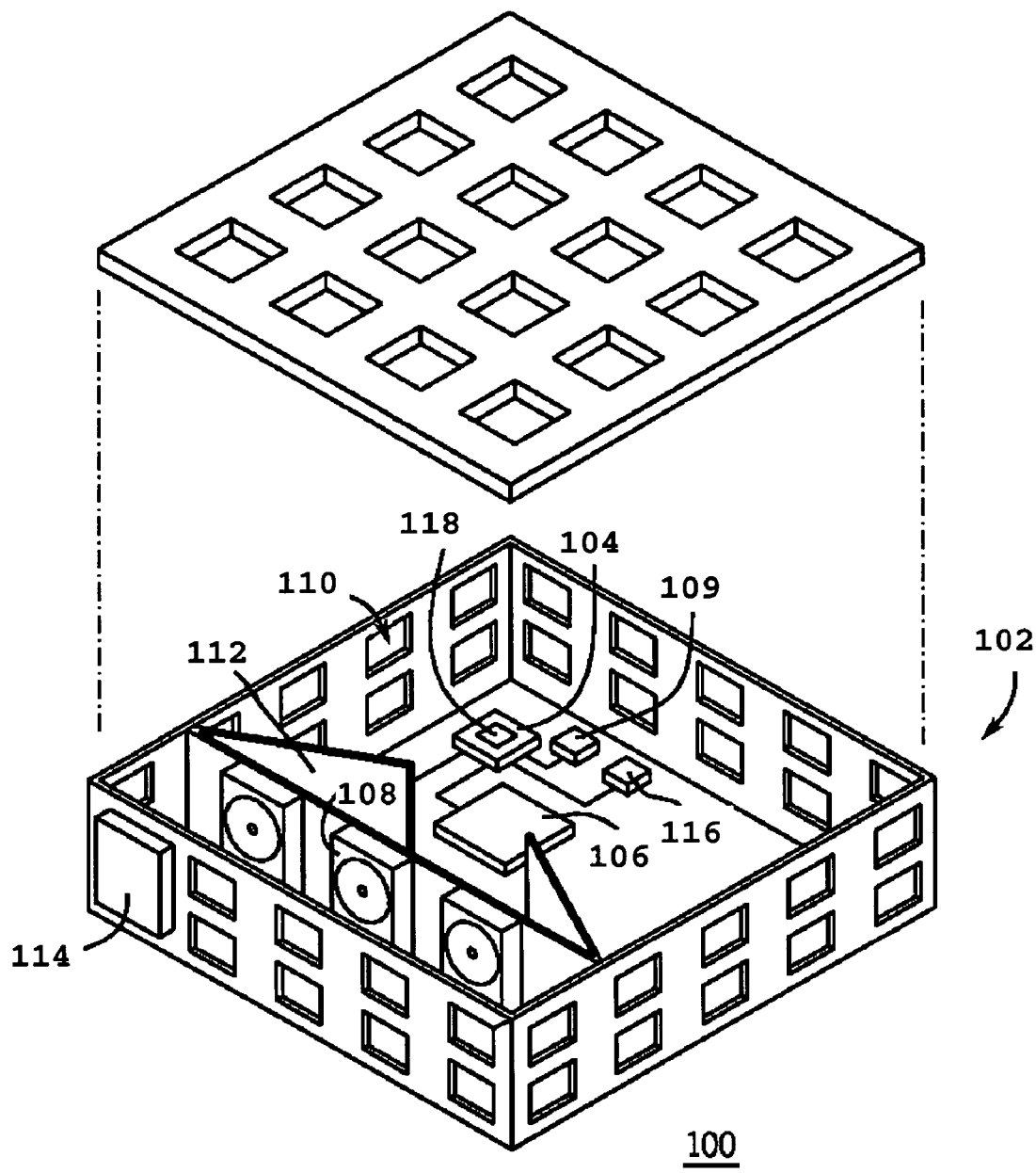
FIG. 1 is a partially exploded, perspective representation of one exemplary implementation of an apparatus that comprises a frame, one or more control components, one or more thermal components, one or more fans, one or more sensor components, one or more apertures, and one or more baffles that emulate one or more operational characteristics of an electronic device.

Turning to FIG. 1, the apparatus 100 in one example comprises a frame 102, one or more control components 104, one or more thermal components 106, zero or more fans 108, and zero or more speakers 109. The frame 102 in one example comprises a metal case, for example, made from aluminum and/or steel. In one example, the frame 102 comprises a horizontal orientation, for example, a desktop or rack-mount case. In another example, the frame 102 comprises a vertical orientation, for example, a tower or pedestal case.

The frame 102 in one example comprises one or more apertures 110 and/or one or more baffles 112 that serve to promote an adjustability of quantity and/or direction of airflow through the frame 102. The frame 102 in one example conforms to an "EIA RS-310" standard (Electronic Industries Alliance, Arlington, Va., http://www.eia.org). For example, the frame 102 comprises a height interval that is an integral multiple of "U," for example, "1U," "2U," . . . "NU."

The control component 104 in one example is coupled with one or more user interfaces 114 and/or one or more sensor components 116. In a further example, the control component 104 comprises an instance of a recordable data storage medium 118, as described herein. The control component 104 in one example employs the frame 102, the thermal components 106, the fans 108, the apertures 110, the baffles 112, and/or the sensor components 116 to emulate one or more operational characteristics of one or more electronic devices (not shown). Exemplary electronic devices comprise servers, storage devices, and network switches. The control component 104 in one example regulates thermal energy and/or airflow to emulate the operational characteristics of the electronic devices, as described herein.

The control component 104 in one example obtains one or more measurements of one or more of the operational characteristics of the electronic device through employment of the sensor components 116. Exemplary operational characteristics comprise temperature characteristics, thermal energy dissipation characteristics, airflow characteristics, noise characteristics, and fan speed characteristics. For example, the control component 104 employs the measurements to regulate the airflow through the frame 102, the thermal energy generated by the thermal component 106, and/or temperature in the frame 102. In one example, the control component 104 adjusts airflow through the frame 102 by causing the fans 108 to rotate at a given speed. For example, the control component 104 adjusts the speed of the fans 108 through pulse width modulation or voltage control, as will be understood by those skilled in the art. A higher speed of the fans 108 will promote an increase in airflow through the frame 102 and increase noise levels, as will be understood by those skilled in the art. In another example, the control component 104 adjusts one or more of the apertures 110 and the baffles 112 to adjust the airflow through the frame 102. as described herein. The control component 104 in one example emulates one or more operational deficiencies of the electronic device through employment of the frame 102, the thermal components 106, the fans 108, the apertures 110, and/or the baffles 112 In one example, the control component 104 emulates an operational deficiency of one or more of the fans 108, for example, a clogging of blades of the fan with dust. In another example, the control component 104 emulates one or more blockages of one or more of the apertures 110.

The user interface 114 in one example comprises one or more display screens, one or more keypads, one or more input knobs, and/or one or more computer terminals. In a further example, the user interface 114 is located remotely from the frame 102. For example, the user interface 114 comprises an external computer terminal that is electronically coupled with the control component 104 via a communication link and/or wireless interface (not shown).

The user interface 114 in one example presents one or more of the operational characteristics of the electronic device to one or more users, for example, on the display screen. In a further example, the user interface 114 receives one or more parameters from the user for the operational characteristics, for example, through the keypad, as will be appreciated by those skilled in the art. For example, the user employs the user interface 114 to set the thermal energy dissipation of the thermal components 106 and the airflow of the fans 108 to known values for an electronic device. In another example, the user sets the thermal energy dissipation and airflow to theoretical and/or approximate values for an electronic device. In yet another example, the user sets the thermal energy dissipation and airflow to emulate one or more failures of the electronic device.

The thermal component 106 in one example comprises a heating element, for example, a finned strip heater controlled by a solid state relay or silicon-controlled rectifier. The thermal component 106 serves to generate thermal energy in the frame 102. In one example, the thermal component 106 is coupled with the frame 102. The thermal energy is dissipated into the airflow and carried out of the frame 102, as will be understood by those skilled in the art. The control component 104 signals the thermal component 106 to generate a given quantity of thermal energy, for example, fifty watts, to emulate thermal energy dissipation of the electronic device.

The fans 108 in one example are coupled with the frame 102. The fans 108 serve to promote airflow through the frame 102. For example, one or more fans 108 take air into the frame 102 and/or exhaust air from the frame 102. The fans 108 in one example comprise 40 millimeter fans, 80 millimeter fans, and/or 120 millimeter fans. The fans 108 comprise rotational speed, size, and design attributes that determine the airflow generated by the fans 108, as will be understood by those skilled in the art.

The speakers 109 in one example are coupled with the frame 102. The speakers 109 in one example emulate one or more noise characteristics of the electronic device. For example, the speakers 109 generate one or more sounds and/or acoustic vibrations associated with operation of the electronic device. In one example, the speaker 109 emulates sounds associated with a disk drive being accessed and/or diagnostic beeps.

One or more of the apertures 110 in one example are partially or completely blocked to adjust the airflow through the frame 102. In one example, the control component 104 causes a cover (not shown), for example, a plastic bezel or air filter, to partially or completely block the aperture 110. In another example, the user adjusts the cover to partially or completely cover the aperture 110. In yet another example, the user employs a piece of tape, for example, duct tape, to cover the aperture 110. One or more apertures 110 may be covered to provide different paths for airflow through the frame 102. For example, the apertures 110 may be covered such that the frame 102 takes in air from a corner of the frame 102 and exhausts air out a side of the frame 102.

The baffles 112 in one example are repositioned to adjust the airflow through the frame 102. In one example, the control component 104 causes the baffle 112 to redirect a portion of the airflow through the frame 102. In another example, the user repositions the baffle 112 to redirect the portion of the airflow through the frame 102. One or more baffles 112 may be added or removed from the frame 102 to promote an adjustability of the airflow through the frame 102. One or more covers of the apertures 110 and one or more baffles 112 in one example are combined. For example, a cover comprises one or more baffles to both limit and direct airflow through the cover. In one example, the user adjusts airflow through the frame 102 to emulate airflow of an electronic device.

Figure 2:
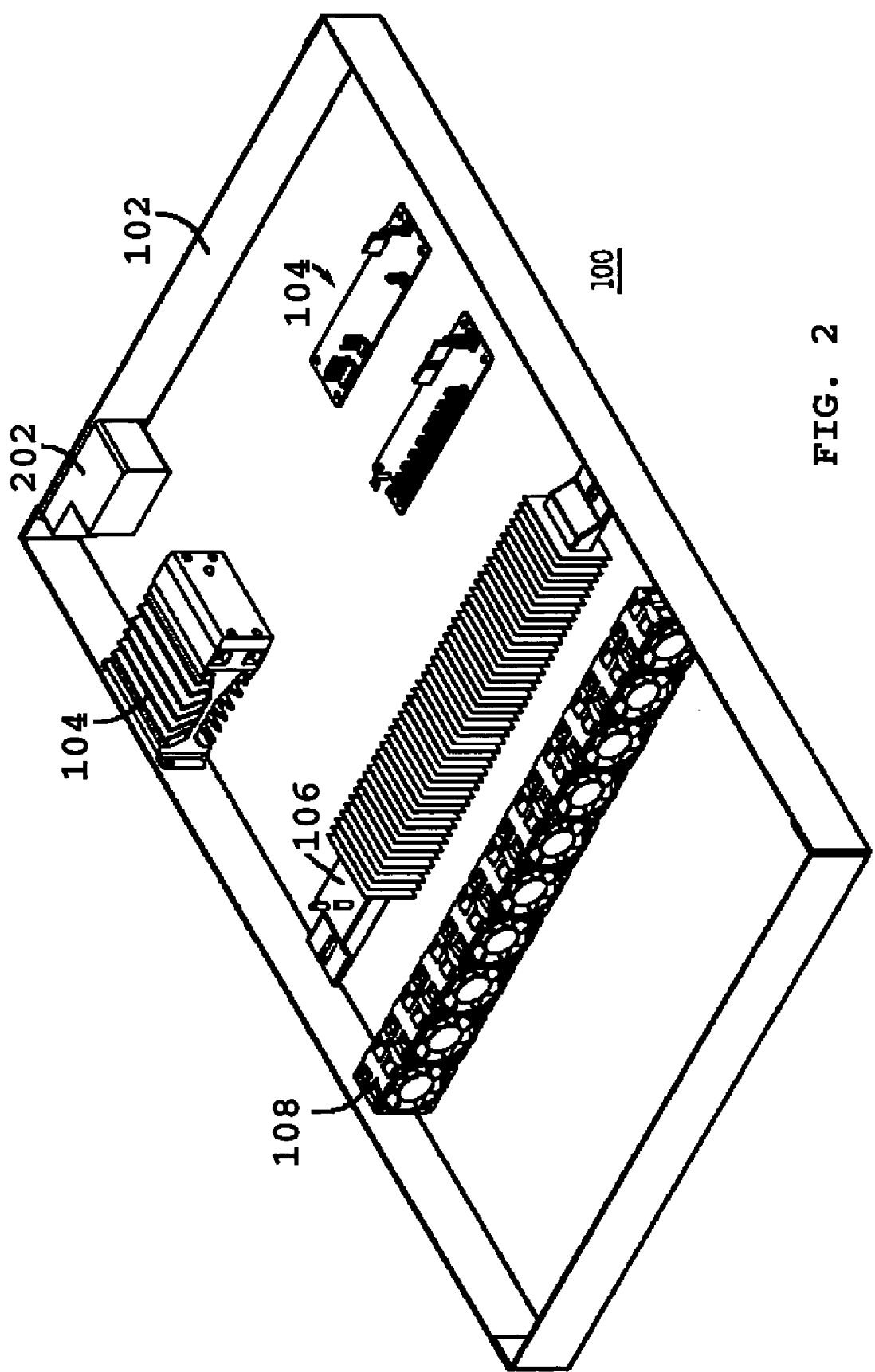
FIG. 2 is a partial, perspective representation of another exemplary implementation of the apparatus of FIG. 1 that comprises a frame, one or more control components, one or more thermal components, one or more fans, and one or more interface ports that emulate one or more operational characteristics of the electronic device.

Turning to FIG. 2, the apparatus 100 in one example further comprises one or more interface ports 202. The interface port 202 in one example provide an interface for receiving external power, for example, alternating current. In another example, the interface port 202 provides an interface for a communication link, for example, a communication link to a remotely located user interface 114.

Figure 3:
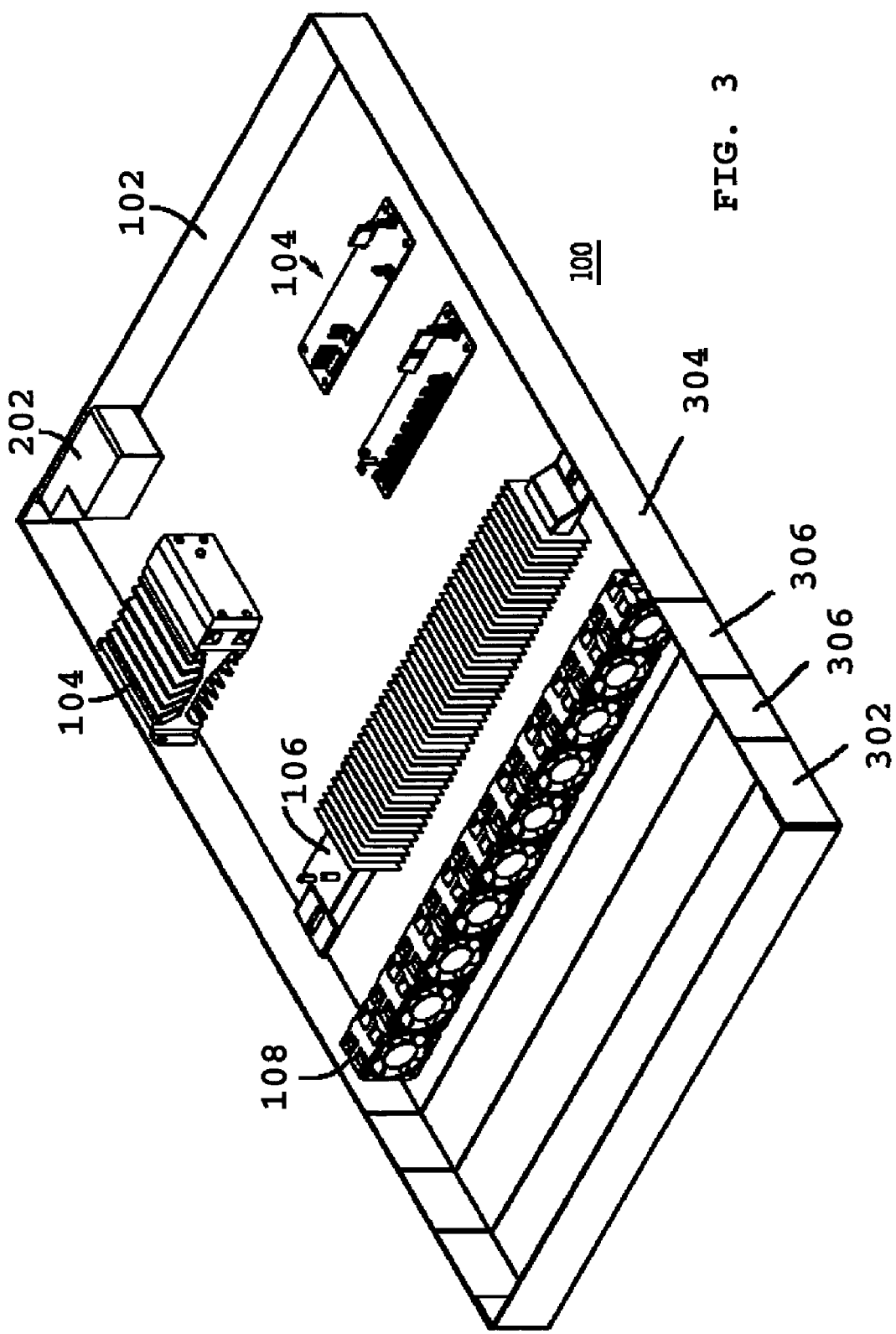
FIG. 3 is a partial, perspective representation of yet another implementation of the apparatus of FIG. 2 that further illustrates first and second end frame portions and intermediate frame portions of the apparatus.
Figure 4:
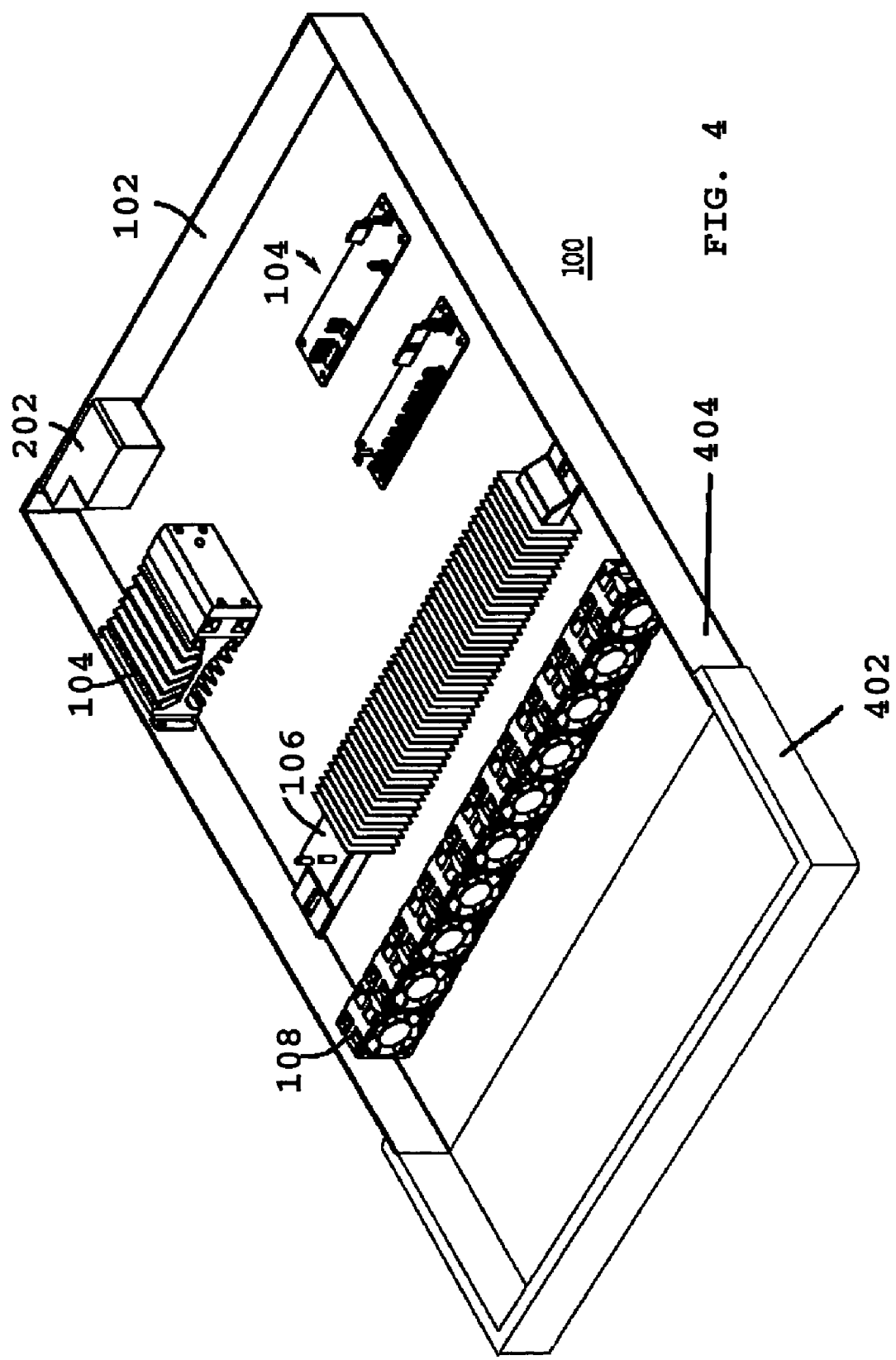
FIG. 4 is a partial, perspective representation of another implementation of the apparatus of FIG. 2 that further illustrates first and second frame portions of the apparatus.

Turning to FIGS. 3–4, the frame 102 in one example comprises a plurality of frame portions that are coupled to promote an adjustability of one or more dimensions of the frame 102. Referring to FIG. 3, the frame 102 in one example comprises a first end portion 302 and a second end portion 304 that are coupled by one or more intermediate frame portions 306. The intermediate frame portions 306 may be added or removed, for example, to adjust a length of the frame 102. Referring to FIG. 4, in another example the frame 102 comprises a first frame portion 402 and a second frame portion 404 that comprise a sliding interface to promote an adjustability of the frame 102.

An illustrative description of exemplary operation of the apparatus 100 is presented, for explanatory purposes. An electronic device (not shown), for example, a network switch, generates given amounts of thermal energy, airflow, and noise during operation. The generated thermal energy requires airflow to sufficiently cool the electronic devices, as will be understood by those skilled in the art. The frame 102 and the thermal components 106 serve to emulate the operational characteristics of the electronic device. Exemplary operational characteristics comprise thermal energy dissipation of the thermal components 106, speed of the fans 108, rate of airflow through the frame 102, fault conditions of the fans 108, noise volume, and temperatures of air entering and exiting the frame 102. For example, the thermal components generate the given amount of thermal energy and the fans 108 create airflow through the frame 102 that is determined by one or more of the fans 108, the apertures 110, and the baffles 112.

The control component 104 and/or a user configure one or more of the frame 102, the thermal components 106, the fans 108, the apertures 110, and the baffles 112 to emulate the operational characteristics of the electronic device. In one example, the user inputs values for the operational characteristics of the network switch. For example, the user employs the user interface 114 to input values such as one hundred watts for thermal energy generation, forty cubic feet per minute for airflow, four thousand revolutions per minute for fan speed, one hundred degrees Fahrenheit for surface temperature, and/or thirty degrees Celsius for ambient temperature, as will be appreciated by those skilled in the art. In another example, the user selects an electronic device from a list of pre-determined electronic devices. For example, the user employs the user interface 114 to select a network server from a list of network equipment and the control component 104 configures the thermal components 106, the fans 108, the apertures 110, and the baffles 112 to emulate the operational characteristics of the network server, as will be appreciated by those skilled in the art.

The apparatus 100 in one example comprises a plurality of components such as hardware, electronic, and/or computer software components. A number of such components can be combined or divided in the apparatus 100. An exemplary component of the apparatus 100 employs and/or comprises a set and/or series of computer instructions written in or implemented with any of a number of programming languages, as will be appreciated by those skilled in the art. The apparatus 100 in one example comprises any (e.g., horizontal, oblique, or vertical) orientation, with the description and figures herein illustrating one exemplary orientation of the apparatus 100, for explanatory purposes.

The apparatus 100 in one example employs one or more computer-readable signal-bearing media. An example of a computer-readable signal-bearing medium for the apparatus 100 comprises the recordable data storage medium 118 of the control component 104. For example, the computer-readable signal-bearing medium for the apparatus 100 comprises one or more of a magnetic, electrical, optical, biological, and atomic data storage medium. In one example, the computer-readable signal-bearing medium comprises a modulated carrier signal transmitted over a network comprising or coupled with the apparatus 100, for instance, one or more of a telephone network, a local area network ("LAN"), the internet, and a wireless network.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
one or more control components that emulate one or more operational characteristics of one or more electronic devices, before a planned presence of the one or more electronic devices, through employment of one or more actual thermal components coupled with an actual frame;
wherein the one or more control components regulate actual thermal energy generated by the one or more actual thermal components to physically emulate one or more of the one or more operational characteristics before the planned presence of the one or more electronic devices;
wherein the one or more control components emulate one or more of the one or more operational characteristics of the one or more electronic devices, before the planned presence of the one or more electronic devices, through employment of one or more actual fans coupled with the actual frame;
wherein one or more of the one or more actual thermal components and one or more of the one or more actual fans at least in part physically substitute for one or more of the one or more electronic devices before the planned presence of the one or more electronic devices.

2. The apparatus of claim 1, wherein one or more of the one or more control components regulate actual airflow through the actual frame generated by the one or more actual fans to physically emulate one or more of the one or more operational characteristics before the planned presence of the one or more electronic devices.

3. The apparatus of claim 2 in combination with the actual frame, wherein the actual frame promotes an adjustability of one or more of actual volume and actual direction of the actual airflow through the actual frame.

4. The apparatus of claim 2 in combination with the actual frame, wherein the actual frame comprises one or more actual apertures that allow user adjustment of one or more of actual volume and actual direction of the actual airflow through the actual frame.

5. The apparatus of claim 2 in combination with the actual frame, wherein the actual frame comprises one or more actual baffles that allow user adjustment of one or more of actual volume and actual direction of the actual airflow through the actual frame.

6. The apparatus of claim 2 in combination with the actual frame, wherein before the planned presence of the one or more electronic devices the one or more control components emulate one or more operational deficiencies of one or more of the one or more electronic devices through employment of one or more of:
the actual frame;
the one or more actual thermal components;

the one or more actual fans;
one or more actual apertures of the actual frame; and
one or more actual baffles of the actual frame.

7. The apparatus of claim 6, wherein the one or more operational deficiencies of the one or more of the one or more electronic devices comprise one or more of:
   operational deficiency of one or more of the one or more actual fans; and
   one or more blockages of one or more of the one or more actual apertures.

8. The apparatus of claim 2, wherein one or more of the one or more control components obtain one or more actual measurements that physically emulate one or more of the one or more operational characteristics through employment of one or more actual sensor components before the planned presence of the one or more electronic devices.

9. The apparatus of claim 8, wherein one or more of the one or more control components adjust one or more of the actual thermal energy, actual volume of the actual airflow through the actual frame, and actual direction of the actual airflow through the actual frame based on one or more of the one or more actual measurements to physically emulate the one or more electronic devices before the planned presence of the one or more electronic devices.

10. The apparatus of claim 2, wherein one or more of the one or more control components obtain one or more actual measurements that physically emulate one or more of the one or more operational characteristics through employment of one or more actual sensor components before the planned presence of the one or more electronic devices;
   wherein the one or more control components comprise one or more user interfaces that present one or more of the one or more actual measurements to one or more users.

11. The apparatus of claim 10, wherein one or more of the one or more user interfaces receive one or more parameters from one or more of the one or more users;
   wherein the one or more of the one or more control components adjust one or more of the actual thermal energy, actual volume of the actual airflow through the actual frame, and actual direction of the actual airflow through the actual frame based on the one or more parameters from the user to physically emulate the one or more electronic devices before the planned presence of the one or more electronic devices.

12. The apparatus of claim 1, wherein the one or more operational characteristics comprise one or more of:
   one or more temperature characteristics;
   one or more thermal energy dissipation characteristics;
   one or more airflow characteristics; and
   one or more noise characteristics;
   wherein before the planned presence of the one or more electronic devices the one or more control components emulate one or more of the one or more temperature characteristics, the one or more thermal energy dissipation characteristics, the one or more airflow characteristics, and the one or more noise characteristics through employment of the one or more actual thermal components coupled with the actual frame and the one or more actual fans coupled with the frame.

13. The apparatus of claim 1, wherein before the planned presence of the one or more electronic devices the one or more control components emulate one or more noise characteristics of the one or more electronic devices through employment of one or more actual speaker components coupled with the actual frame;
   wherein one or more of the one or more actual speaker components at least in part physically substitute for one or more of the one or more electronic devices before the planned presence of the one or more electronic devices.

14. The apparatus of claim 1, wherein one or more of the one or more actual thermal components comprise one or more of an actual silicon controlled rectifier and an actual solid state relay.

15. The apparatus of claim 1 in combination with the actual frame, wherein the actual frame conforms to an Electronic Industries Alliance RS-310 standard.

16. The apparatus of claim 1 in combination with the actual frame, wherein one or more portions of the actual frame allow user adjustment of one or more actual dimensions of the actual frame.

17. The apparatus of claim 16, wherein the one or more portions of the actual frame comprise an actual first frame portion and an actual second frame portion, wherein the actual first frame portion and actual second frame portion comprise an actual slidable interface to allow user adjustment of one or more actual dimensions of the actual frame.

18. The apparatus of claim 16, wherein the one or more portions of the actual frame comprise an actual first frame portion, an actual second frame portion, and one or more actual third frame portions, wherein the one or more actual third frame portions couple the actual first frame portion and actual second frame portion to allow user adjustment of the one or more actual dimensions of the actual frame.

19. An apparatus, comprising:
   means for regulating generation of actual thermal energy;
   means for regulating generation of actual airflow;
   means for emulating one or more operational characteristics of one or more electronic devices for the one or more electronic devices through employment of the actual thermal energy before a planned presence of the one or more electronic devices;
   wherein the means for emulating the one or more operational characteristics of the one or more electronic devices for the one or more electronic devices through employment of the actual thermal energy before the planned presence of the one or more electronic devices comprises:
   means for physically emulating the one or more operational characteristics of the one or more electronic devices for the one or more electronic devices through employment of the actual airflow before the planned presence of the one or more electronic devices;
   wherein the actual thermal energy and the actual airflow at least in part physically substitute for one or more of the one or more electronic devices before the planned presence of the one or more electronic devices.

20. The apparatus of claim 19, wherein the means for regulating generation of actual thermal energy comprises:
   means for generating actual thermal energy before the planned presence of the one or more electronic devices.

21. The apparatus of claim 19, further comprising:
   means for obtaining one or more actual measurements that physically emulate one or more of the one or more operational characteristics of the one or more electronic devices before the planned presence of the one or more electronic devices;
   wherein the means for regulating the generation of the actual thermal energy comprises:
   means for regulating the generation of the actual thermal energy through employment of one or more of the one or more actual measurements;

wherein the means for regulating the generation of the actual airflow comprises:

means for regulating the generation of the actual airflow through employment of one or more of the one or more actual measurements.

22. The apparatus of claim 19, further comprising:

means for controlling one or more of actual volume and actual direction of the actual airflow before the planned presence of the one or more electronic devices.

23. A method, comprising the step of:

effecting physical emulation through at least a partial physical substitute of one or more of one or more temperature characteristics, one or more thermal energy dissipation characteristics, one or more airflow characteristics, and one or more noise characteristics of one or more electronic devices for the one or more electronic devices before a planned presence of the one or more electronic devices;

wherein the step of effecting physical emulation through at least a partial physical substitute of the one or more of the one or more temperature characteristics, the one or more thermal energy dissipation characteristics, the one or more airflow characteristics, and the one or more noise characteristics of the one or more electronic devices for the one or more electronic devices before the planned presence of the one or more electronic devices comprises the steps of:

generating actual thermal energy within an actual frame before the planned presence of the one or more electronic devices; and generating actual airflow through the actual frame before the planned presence of the one or more electronic devices.

24. The method of claim 23, further comprising the step of:

generating one or more actual vibrations within the actual frame before the planned presence of the one or more electronic devices.

25. The method of claim 23, further comprising the step of: obtaining one or more actual measurements of the physical emulation of one or more of the one or more of temperature, thermal energy dissipation, airflow, and noise characteristics before the planned presence of the one or more electronic devices.

26. The method of claim 25, wherein the step of obtaining the one or more actual measurements of the physical emulation of the one or more of the one or more of temperature, thermal energy dissipation, airflow, and noise characteristics before the planned presence of the one or more electronic devices comprises the step of:

obtaining one or more actual measurements of the physical emulation of one or more of actual temperature characteristics, actual thermal energy dissipation characteristics, actual airflow characteristics, and actual noise characteristics physically representative of the presence of the one or more electronic devices before the planned presence of the one or more electronic devices.

27. The method of claim 23, wherein the step of effecting physical emulation through at least a partial physical substitute of the one or more of the one or more temperature characteristics, the one or more thermal energy dissipation characteristics, the one or more airflow characteristics, and the one or more noise characteristics of the one or more electronic devices before the planned presence of the one or more electronic devices comprises the steps of:

receiving one or more parameters from a user interface; and adjusting, before the planned presence of the one or more electronic devices, the physical emulation of one or more of the one or more temperature characteristics, the one or more thermal energy dissipation characteristics, the one or more airflow characteristics, and the one or more noise characteristics based on the one or more parameters from the user interface.

* * * * *